(12) United States Patent
Ji

(10) Patent No.: US 12,094,563 B2
(45) Date of Patent: Sep. 17, 2024

(54) SIGNAL LINE STRUCTURE, SIGNAL LINE DRIVING METHOD, AND SIGNAL LINE CIRCUIT

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 223 days.

(21) Appl. No.: 17/805,940

(22) Filed: Jun. 8, 2022

(65) Prior Publication Data

US 2023/0223053 A1    Jul. 13, 2023

Related U.S. Application Data

(63) Continuation of application No. PCT/CN2022/087463, filed on Apr. 18, 2022.

(30) Foreign Application Priority Data

Jan. 11, 2022  (CN) .......................... 202210028112.2

(51) Int. Cl.
| | | |
|---|---|---|
| *H03K 19/00* | (2006.01) | |
| *G11C 7/10* | (2006.01) | |
| *G11C 11/4093* | (2006.01) | |
| *G11C 11/4096* | (2006.01) | |
| *H03K 19/0185* | (2006.01) | |

(52) U.S. Cl.
CPC .......... *G11C 7/1006* (2013.01); *G11C 7/1048* (2013.01); *G11C 11/4093* (2013.01); *G11C 11/4096* (2013.01); *H03K 19/0185* (2013.01)

(58) Field of Classification Search
CPC ................ G11C 7/1006; G11C 7/1048; G11C 11/4093; G11C 11/4096; H03K 19/0185
See application file for complete search history.

(56) References Cited

U.S. PATENT DOCUMENTS

| | | | | |
|---|---|---|---|---|
| 5,901,091 A | * | 5/1999 | Lee ........................ | G11C 7/22 365/207 |
| 6,127,849 A | * | 10/2000 | Walker ........... | H03K 19/018592 327/27 |
| 6,184,714 B1 | | 2/2001 | Kirsch et al. | |
| 6,278,300 B1 | * | 8/2001 | Urakawa ........ | H03K 19/018592 327/333 |

(Continued)

FOREIGN PATENT DOCUMENTS

| | | |
|---|---|---|
| CN | 102077480 A | 5/2011 |
| CN | 208226997 U | 12/2018 |

(Continued)

OTHER PUBLICATIONS

TW Office Action cited in TW111122692, mailed Jul. 20, 2023, 11 pages.
International Search Report cited in PCT/CN2022/087463 mailed Sep. 28, 2022, 10 pages.

(Continued)

*Primary Examiner* — Kurtis R Bahr
(74) *Attorney, Agent, or Firm* — Kilpatrick Townsend & Stockton LLP

(57) ABSTRACT

The present disclosure provides a signal line structure, a signal line driving method, and a signal line circuit. The signal line structure includes a plurality of parallel signal lines, where each of the signal lines is maintained in a drive state at any time.

10 Claims, 5 Drawing Sheets

(56) References Cited

U.S. PATENT DOCUMENTS

| | | | |
|---|---|---|---|
| 6,470,054 B1* | 10/2002 | Boudry | H04L 25/0278 375/257 |
| 6,961,802 B2* | 11/2005 | Mori | G06F 13/4243 710/310 |
| 7,079,444 B2* | 7/2006 | Lee | G11C 8/06 365/233.5 |
| 7,102,545 B2* | 9/2006 | Choi | H04L 25/061 327/563 |
| 7,551,000 B2 | 6/2009 | Huang et al. | |
| 9,166,650 B2 | 10/2015 | Wilson et al. | |
| 10,804,884 B1 | 10/2020 | Tsai et al. | |
| 2004/0128595 A1 | 7/2004 | Schoenborn et al. | |
| 2004/0223365 A1* | 11/2004 | Choi | G11C 7/1078 365/154 |
| 2006/0062039 A1* | 3/2006 | Ruckerbauer | G11C 7/1066 365/51 |
| 2012/0195153 A1 | 8/2012 | Kwon et al. | |
| 2014/0016404 A1 | 1/2014 | Kim et al. | |

FOREIGN PATENT DOCUMENTS

| | | |
|---|---|---|
| CN | 111262585 A | 6/2020 |
| CN | 113162601 A | 7/2021 |
| JP | 2001007742 A | 1/2001 |
| JP | 2003023086 A | 1/2003 |
| JP | 2006345258 A | 12/2006 |
| JP | 2011507358 A | 3/2011 |
| JP | 2011527144 A | 10/2011 |
| JP | 2013009309 A | 1/2013 |
| JP | 2015527797 A | 9/2015 |
| KR | 20120088446 A | 8/2012 |
| TW | 200824314 A | 6/2008 |

OTHER PUBLICATIONS

Korean Intellectual Property Office, Office Action Issued in Application No. 10-2022-7026334, Jun. 24, 2024, 20 pages.
Japanese Patent Office, Office Action Issued in Application No. 2022-543705, Jul. 16, 2024, 8 pages.

* cited by examiner

800

Control a plurality of parallel signal lines to be maintained in a drive state at any time — S10

SIGNAL LINE STRUCTURE, SIGNAL LINE DRIVING METHOD, AND SIGNAL LINE CIRCUIT

CROSS-REFERENCE TO RELATED APPLICATIONS

This is a continuation of International Application No. PCT/CN2022/087463, filed on Apr. 18, 2022, which claims the priority to Chinese Patent Application No. 202210028112.2, titled "SIGNAL LINE STRUCTURE, SIGNAL LINE DRIVING METHOD, AND SIGNAL LINE CIRCUIT" and filed on Jan. 11, 2022. The entire contents of International Application No. PCT/CN2022/087463 and Chinese Patent Application No. 202210028112.2 are incorporated herein by reference.

TECHNICAL FIELD

The present disclosure relates to the technical field of integrated circuit manufacturing, and specifically to a signal line structure, a signal line driving method, and a signal line circuit.

BACKGROUND

In a common data path, since the direction of data transition is random, crosstalk occurs between different parallel adjacent signal lines, which affects the data timing. In some cases, a grounded wire is inserted for isolation to ensure the timing consistency during the data transition. In addition, a state keeper is required to reduce the influence of crosstalk between the signal lines. Both an isolation wire and a state keeper will occupy additional lines and layout area, resulting in a larger layout area for the signal lines.

It should be noted that the information disclosed above is merely intended to facilitate a better understanding of the background of the present disclosure, and therefore may include information that does not constitute the prior art known to those of ordinary skill in the art.

SUMMARY

A signal line structure is provided according to a first aspect of the present disclosure, and includes a plurality of parallel signal lines, where each of the signal lines is maintained in a drive state at any time.

A signal line driving method is provided according to a second aspect of the present disclosure, is applied to the signal line structure described in any one of the above, and includes: controlling a plurality of parallel signal lines to be maintained in a drive state at any time.

A signal line circuit is provided according to a third aspect of the present disclosure, and includes: a first driver provided with an input terminal for receiving a first input signal, an enable terminal connected to a first node, and an output terminal connected to a signal line; a second driver provided with an input terminal for receiving a second input signal, an enable terminal connected to a second node, and an output terminal connected to the signal line; and an inverter provided with an input terminal connected to the first node and an output terminal connected to the second node, where the first node is configured to receive a driver enable signal, and the driver enable signal includes a first level configured to control the first driver to be maintained in a drive state and the second driver to be maintained in a high-impedance state, and a second level configured to control the second driver to be maintained in the drive state and the first driver to be maintained in the high-impedance state.

It should be understood that the above general description and the following detailed description are only exemplary and explanatory, and should not be construed as a limitation to the present disclosure.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure. Apparently, the drawings in the following description show merely some embodiments of the present disclosure, and those of ordinary skill in the art may still derive other drawings from these drawings without creative efforts.

DETAILED DESCRIPTION

Figure 1:
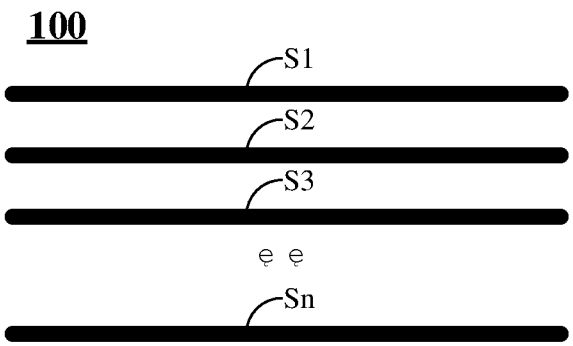
FIG. 1 is a schematic diagram of a signal line structure according to one exemplary embodiment of the present disclosure.

The exemplary implementations are described more comprehensively below with reference to the accompanying drawings. However, the exemplary implementations can be implemented in various forms and should not be construed as being limited to examples described herein. On the contrary, these implementations are provided such that the present disclosure is more comprehensive and complete, and fully conveys the concept of the exemplary implementations to those skilled in the art. The described features, structures, or characteristics may be incorporated into one or more implementations in any suitable manner. In the following description, many specific details are provided to give a full understanding of the implementations of the present disclosure. However, those skilled in the art will be aware that the technical solutions of the present disclosure may be practiced with one or more of the specific details omitted, or other methods, components, apparatuses, steps, and the like may be used. In other cases, the publicly known technical solutions are not illustrated or described in detail, so as to avoid overshadowing and obscuring various aspects of the present disclosure.

In addition, the accompanying drawings are merely schematic diagrams of the present disclosure, and identical reference numerals in the accompanying drawings denote identical or similar parts. Therefore, repeated description thereof will be omitted. Some of the block diagrams shown in the accompanying drawings are functional entities, and do not necessarily correspond to physically or logically independent entities. These functional entities may be implemented in the form of software, or implemented in one or more hardware modules or integrated circuits, or implemented in different networks and/or processor apparatuses and/or microcontroller apparatuses.

The following describes in detail the exemplary implementations of the present disclosure with reference to the accompanying drawings.

FIG. 1 is a schematic diagram of a signal line structure according to one exemplary embodiment of the present disclosure.

Referring to FIG. 1, the signal line structure 100 may include:

a plurality of parallel signal lines S1-Sn, where each of the signal lines is maintained in a drive state at any time.

There is no need to provide an isolation line between every two of the plurality of parallel signal lines S1-Sn, and there is no need to provide a state keeper after signal transmission, such that the wiring area can be effectively saved. Since each of the signal lines is maintained in the drive state at any time, the crosstalk between the parallel signal lines will not cause signal transition on the signal lines, such that the signal stability can be effectively improved, and the increase of crosstalk, the signal transition on the signal lines, and transmission errors caused by high-density wiring are avoided. Therefore, the embodiments of the present disclosure can improve the signal stability while reducing the area of high-density wiring.

There may be various ways to control each of the signal lines to be maintained in the drive state at any time, and some embodiments will be described below with reference to the accompanying drawings.

Figure 2:
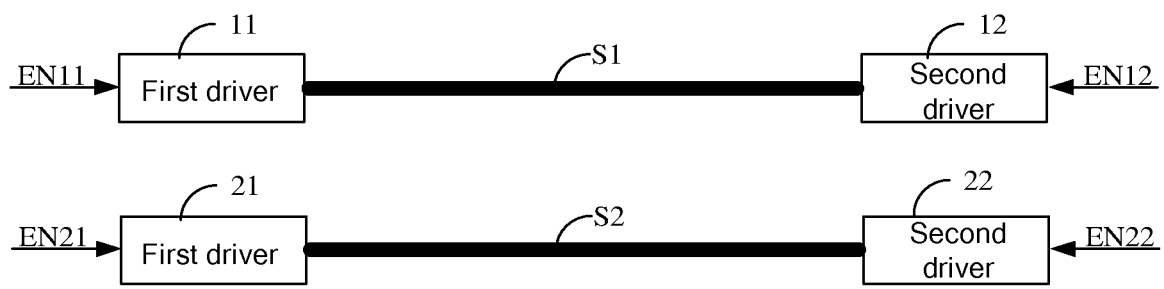
FIG. 2 is a schematic diagram of a drive mode of signal lines according to one embodiment of the present disclosure.

FIG. 2 is a schematic diagram of a drive mode of signal lines according to one embodiment of the present disclosure.

Referring to FIG. 2, in one exemplary embodiment of the present disclosure, two ends of the signal line S1 are respectively connected to a first driver 11 and a second driver 12, and at the same time, only one of the first driver 11 and the second driver 12 of the signal line S1 is maintained in a drive state. The signal line S2 is parallel and adjacent to the signal line S1, two ends of the signal line S2 are respectively connected to a first driver 21 and a second driver 22, and at the same time, only one of the first driver 21 and the second driver 22 of the signal line S2 is maintained in the drive state.

Still referring to FIG. 2, in one embodiment, the first driver 11 of the signal line S1 is maintained in the drive state when a first enable signal EN11 is at a first level and maintained in a high-impedance state when the first enable signal EN11 is at a second level; and the second driver 12 is maintained in the drive state when a second enable signal EN12 is at the first level and maintained in the high-impedance state when the second enable signal EN12 is at the second level. When the first enable signal EN11 and the second enable signal EN12 are controlled by two levels, the first level is, for example, a high level, and the second level is, for example, a low level. Or, the first level is, for example, a low level, and the second level is, for example, a high level. The high level is, for example, a state greater than or equal to a power voltage, and the low level is, for example, a state less than or equal to a ground voltage. Herein, the high level and the low level are relative, and a specific voltage range included needs to be determined according to a specific device. For example, for an N-type field-effect transistor, the high level refers to a gate voltage range in which the N-type field-effect transistor can be turned on, and the low level refers to a gate voltage range in which the N-type field-effect transistor can be turned off; and for a P-type field-effect transistor, the low level refers to a gate voltage range in which the P-type field-effect transistor can be turned on, and the high level refers to a gate voltage range in which the P-type field-effect transistor can be turned off.

Correspondingly, the first driver 21 of the signal line S2 is maintained in the drive state when a first enable signal EN21 is at a first level and maintained in a high-impedance state when the first enable signal EN21 is at a second level; and the second driver 22 is maintained in the drive state when a second enable signal EN22 is at the first level and maintained in the high-impedance state when the second enable signal EN22 is at the second level.

Figure 3A:
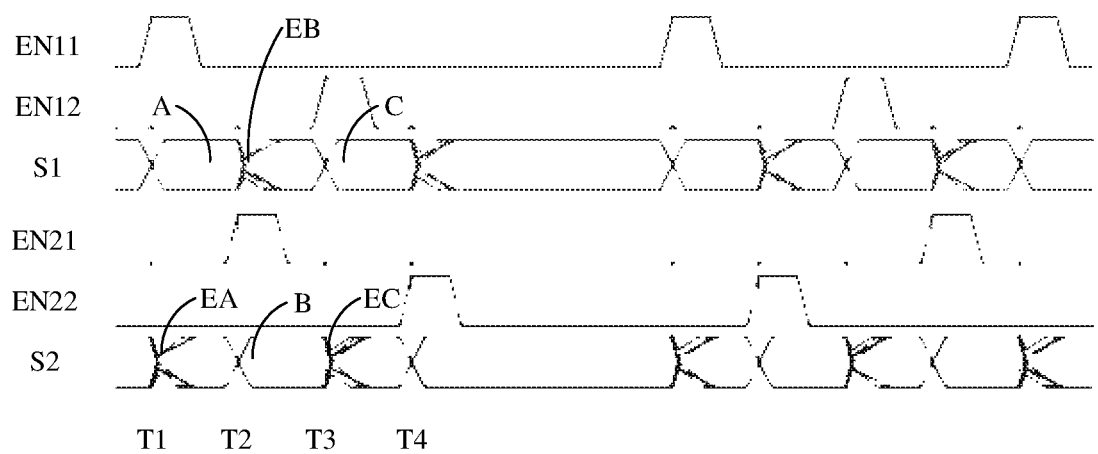
FIG. 3A is a schematic diagram of crosstalk between two adjacent signal lines according to the related art.

FIG. 3A is a schematic diagram of crosstalk between two adjacent signal lines according to the related art.

Figure 3B:
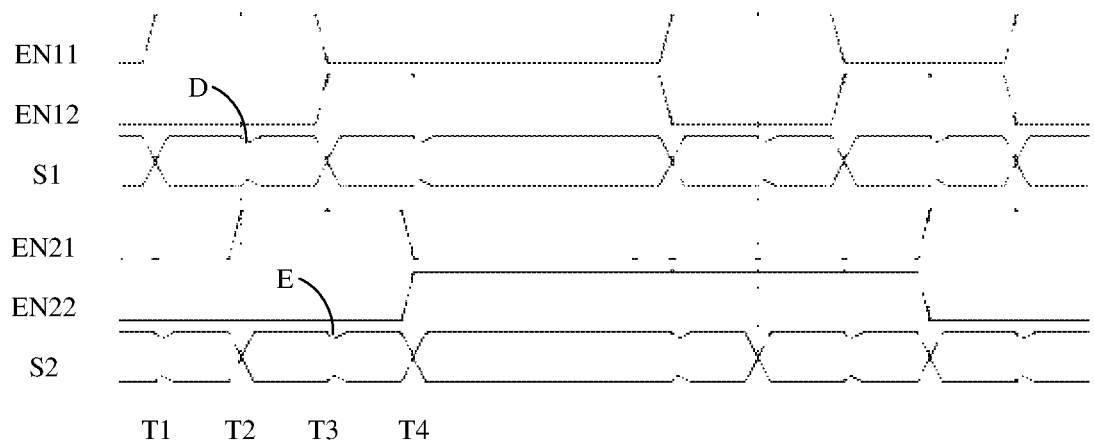
FIG. 3B is a schematic diagram of crosstalk between two adjacent signal lines according to one embodiment of the present disclosure.

FIG. 3B is a schematic diagram of crosstalk between two adjacent signal lines according to one embodiment of the present disclosure.

In FIG. 3A and FIG. 3B, the signal line S1 and the signal line S2 are two parallel adjacent signal lines. Corresponding to the signal line S1, the first enable signal is EN11, and the second enable signal is EN12; and corresponding to the signal line S2, the first enable signal is EN21, and the second enable signal is EN22.

Referring to FIG. 3A, in the related art, at a first time T1, a high-level pulse appears on the first enable signal EN11 corresponding to the signal line S1, and the signal line S1 is driven by the first driver 11 to generate a signal A. At the same time, the first driver 21 and the second driver 22 at the two ends of the signal line S2 adjacent and parallel to the signal line S1 are both in the high-impedance state, and have no driving capability for the signal line S2. Under the influence of the signal A, a crosstalk error EA occurs on the signal line S2. At a second time T2, a high-level pulse appears on the first enable signal EN21 corresponding to the signal line S2, and the signal line S2 is driven by the first driver 21 to generate a signal B. At the same time, the first driver 11 and the second driver 12 at the two ends of the signal line S1 adjacent and parallel to the signal line S2 are both in the high-impedance state, and have no driving capability for the signal line S1. Under the influence of the signal B, a crosstalk error EB occurs on the signal line S1.

Similarly, at a third time T3, when a high-level pulse appears on the second enable signal EN12 corresponding to the signal line S1, the signal line S1 is driven by the second driver 12 to generate signal transition (a signal C), which influences a state of the signal B on the signal line S2, and a crosstalk error EC occurs on the signal line S2. At a fourth time T4, when a high-level pulse appears on the second enable signal EN22 corresponding to the signal line S2, the signal line S2 is driven by the second driver 22 to generate signal transition, which influences a state of the signal C on the signal line S1, and a crosstalk error also occurs.

Therefore, in the related art, the crosstalk is likely to occur between two parallel adjacent signal lines, resulting in errors in data transmission.

Referring to FIG. 3B, in one embodiment of the present disclosure, at the same time, only one of the first enable signal EN11 and the second enable signal EN12 of the signal line S1 is at the high level, and at the same time, only one of the first enable signal EN21 and the second enable signal EN22 of the signal line S2 is at the high level.

At the second time T2, the first enable signal EN21 of the signal line S2 changes to the high level, the first driver 21 of the signal line S2 changes to the drive state, and data transition occurs on the signal line S2. Since the first enable signal EN11 of the signal line S1 is also at the high level, and the first driver 11 of the signal line S1 is also in the drive state, a data signal on the signal line S1 is less influenced by the crosstalk (a point D). At the third time T3, the second enable signal EN12 of the signal line S1 changes to the high level, the second driver 12 of the signal line S1 changes to the drive state, and data transition occurs on the signal line S1. Since the first enable signal EN21 of the signal line S2 is also at the high level, and the first driver 21 of the signal line S2 is also in the drive state, a data signal on the signal line S2 is less influenced by the crosstalk (a point E). Similarly, it can be deduced that at the first time T1 and the fourth time T4, the data signals on the signal line S1 and the signal line S2 are also less influenced by the crosstalk.

Therefore, by maintaining only one of the drivers at two ends of the signal line in the drive state at any time, the signal on the signal line can be reduced to be influenced by the data transition and crosstalk of a signal line parallel and adjacent to the signal line, and the signal stability can be maintained. That is, by using the method provided by the embodiment of the present disclosure to control the driver of the signal line, the signal stability can be maintained without providing an isolation line and a state keeper between the signal lines, and the wiring area can be greatly saved.

Figure 4:
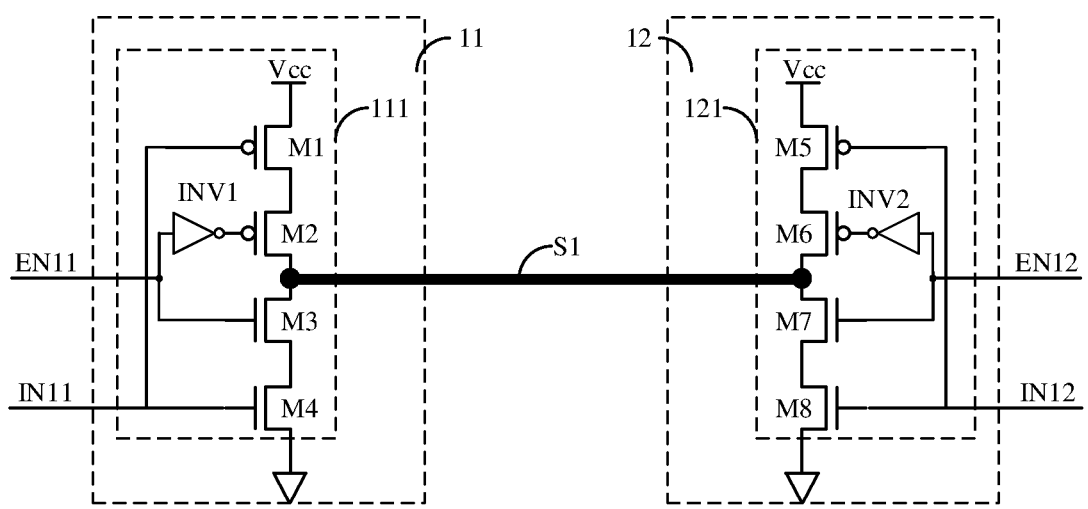
FIG. 4 is a schematic diagram of circuits of a first driver and a second driver of a signal line according to one embodiment of the present disclosure.

FIG. 4 is a schematic diagram of circuits of a first driver and a second driver of a signal line according to one embodiment of the present disclosure.

Referring to FIG. 4, in one embodiment of the present disclosure, the first driver 11 or the second driver 12 of the signal line S1 includes at least one gating inverter.

In the embodiment shown in FIG. 4, a first gating inverter 111 in the first driver 11 is provided with an input terminal electrically connected to a first input signal IN11, an enable terminal connected to the first enable signal EN11, and an output terminal electrically connected to the signal line S1. A second gating inverter 121 in the second driver 12 is provided with an input terminal electrically connected to a second input signal IN12, an enable terminal connected to the second enable signal EN12, and an output terminal electrically connected to the signal line S1.

The first gating inverter 111 includes a first transistor M1, a second transistor M2, a third transistor M3, and a fourth transistor M4 connected in sequence. The first transistor M1 and the second transistor M2 are both P-type transistors, and a source of the first transistor M1 is connected to a power voltage Vcc. The third transistor M3 and the fourth transistor M4 are both N-type transistors, and a source of the fourth transistor M4 is grounded. A gate of the first transistor M1 and a gate of the fourth transistor M4 are connected as the input terminal of the first gating inverter 111 and electrically connected to the first input signal IN11. A gate of the second transistor M2 is connected to an output terminal of an inverter INV1, an input terminal of the inverter INV1 is connected to a gate of the third transistor M3, and the gate of the third transistor M3 is as the enable terminal of the first gating inverter 111 and connected to the first enable signal EN11.

The second gating inverter 121 includes a fifth transistor M5, a sixth transistor M6, a seventh transistor M7, and an eighth transistor M8 connected in sequence. The fifth transistor M5 and the sixth transistor M6 are both P-type transistors, and a source of the fifth transistor M5 is connected to the power voltage Vcc. The seventh transistor M7 and the eighth transistor M8 are both N-type transistors, and a source of the eighth transistor M8 is grounded. A gate of the fifth transistor M5 and a gate of the eighth transistor M8 are connected as the input terminal of the second gating inverter 121 and electrically connected to the first input signal IN11. A gate of the sixth transistor M6 is connected to an output terminal of an inverter INV2, an input terminal of the inverter INV2 is connected to a gate of the seventh transistor M7, and the gate of the seventh transistor M7 is as the enable terminal of the second gating inverter 121 and connected to the second enable signal EN12.

When the first enable signal EN11 is at the high level, the second transistor M2 and the third transistor M3 in the first gating inverter 111 are both turned on, the first gating inverter 111 is in the drive state, and the signal on the signal line S1 changes with the first input signal IN11. When the first enable signal EN11 is at the low level, the second transistor M2 and the third transistor M3 in the first gating inverter 111 are both turned off, the first gating inverter 111 is in the high-impedance state, and the signal on the signal line S1 does not change with the first input signal IN11.

Similarly, when the second enable signal EN12 is at the high level, the sixth transistor M6 and the seventh transistor M7 in the second gating inverter 121 are both turned on, the second gating inverter 121 is in the drive state, and the signal on the signal line S1 changes with the second input signal IN12. When the second enable signal EN12 is at the low level, the sixth transistor M6 and the seventh transistor M7 in the second gating inverter 121 are both turned off, the second gating inverter 121 is in the high-impedance state, and the signal on the signal line S1 does not change with the second input signal IN12.

When only one of the first driver 11 and the second driver 12 is configured to be maintained in the drive state at the same time, only one of the first enable signal EN11 and the second enable signal EN12 can be set to be at the high level at the same time, as shown in FIG. 3B. In one exemplary embodiment of the present disclosure, the second enable signal EN12 can be obtained by inverting the first enable signal EN11 through the inverter.

There may be one or more gating inverters in both the first driver 11 and the second driver 12, and FIG. 4 is only an example, which is not specifically limited in the present disclosure.

Figure 5:
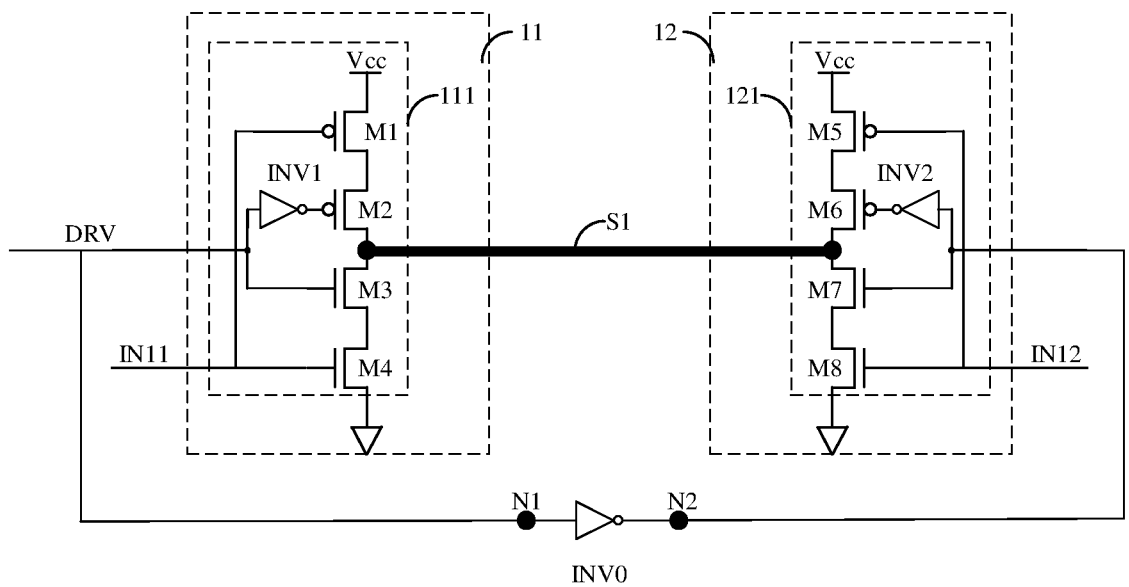
FIG. 5 is a schematic diagram of a connection relationship between a first enable signal and a second enable signal shown in FIG. 4 according to one embodiment of the present disclosure.

FIG. 5 is a schematic diagram of a connection relationship between a first enable signal and a second enable signal shown in FIG. 4 according to one embodiment of the present disclosure.

Referring to FIG. 5, in one exemplary embodiment of the present disclosure, the first driver 11 is provided with an input terminal for receiving the first input signal IN11, an enable terminal connected to a first node N1, and an output terminal connected to the signal line S1. The second driver 12 is provided with an input terminal for receiving the second input signal IN12, an enable terminal connected to a second node N2, and an output terminal connected to the signal line S1. The first node N1 is configured to receive a driver enable signal DRV. The second node N2 and the first node N1 are connected through an odd number of inverters INV0 (only one shown in FIG. 5).

In the embodiment shown in FIG. 5, the driver enable signal DRV can control, no matter in a high-level state or a low-level state, only one of the first driver 11 and the second driver 12 to be maintained in the drive state at the same time.

Figure 6:
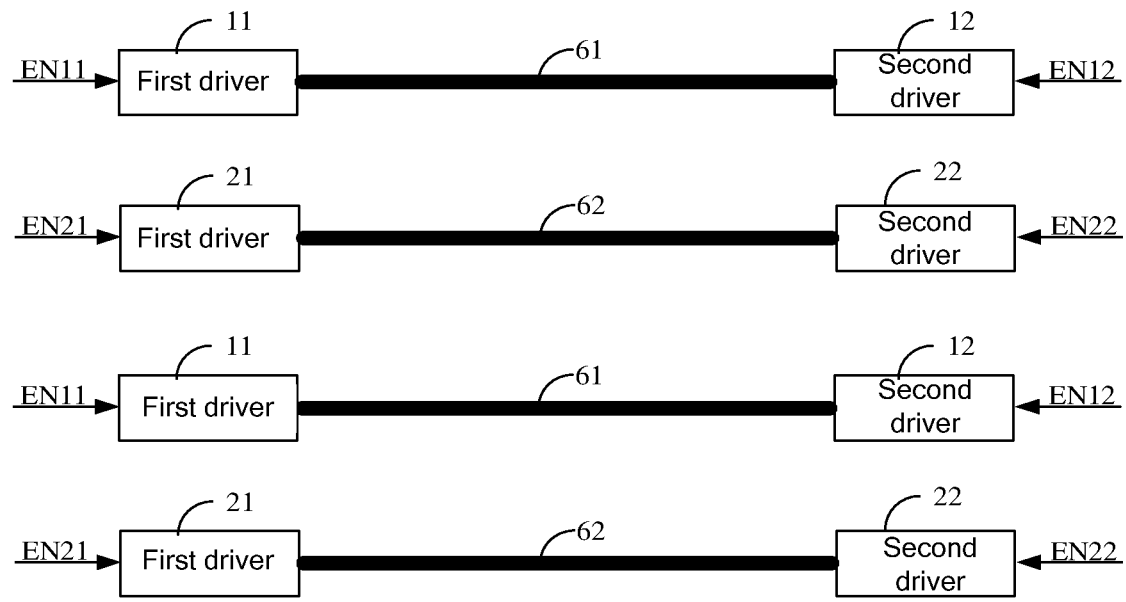
FIG. 6 is a schematic diagram of settings of signal lines according to one embodiment of the present disclosure.

FIG. 6 is a schematic diagram of settings of signal lines according to one embodiment of the present disclosure.

Referring to FIG. 6, in one exemplary embodiment of the present disclosure, the plurality of parallel signal lines include odd data lines 61 and even data lines 62 arranged in a staggered manner. The odd data lines 61 are configured to transmit odd signals obtained according to sampling of odd clocks, the even data lines 62 are configured to transmit even signals obtained according to sampling of even clocks, and there is a phase difference of 180 degrees between the odd clock and the even clock. The first enable signal EN11 corresponding to the odd data lines 61 and the first enable signal EN21 corresponding to the even data lines 62 have different phases, and the second enable signal EN12 corresponding to the odd data lines 61 and the second enable signal EN22 corresponding to the even data lines 62 have different phases.

Figures 7, 8:
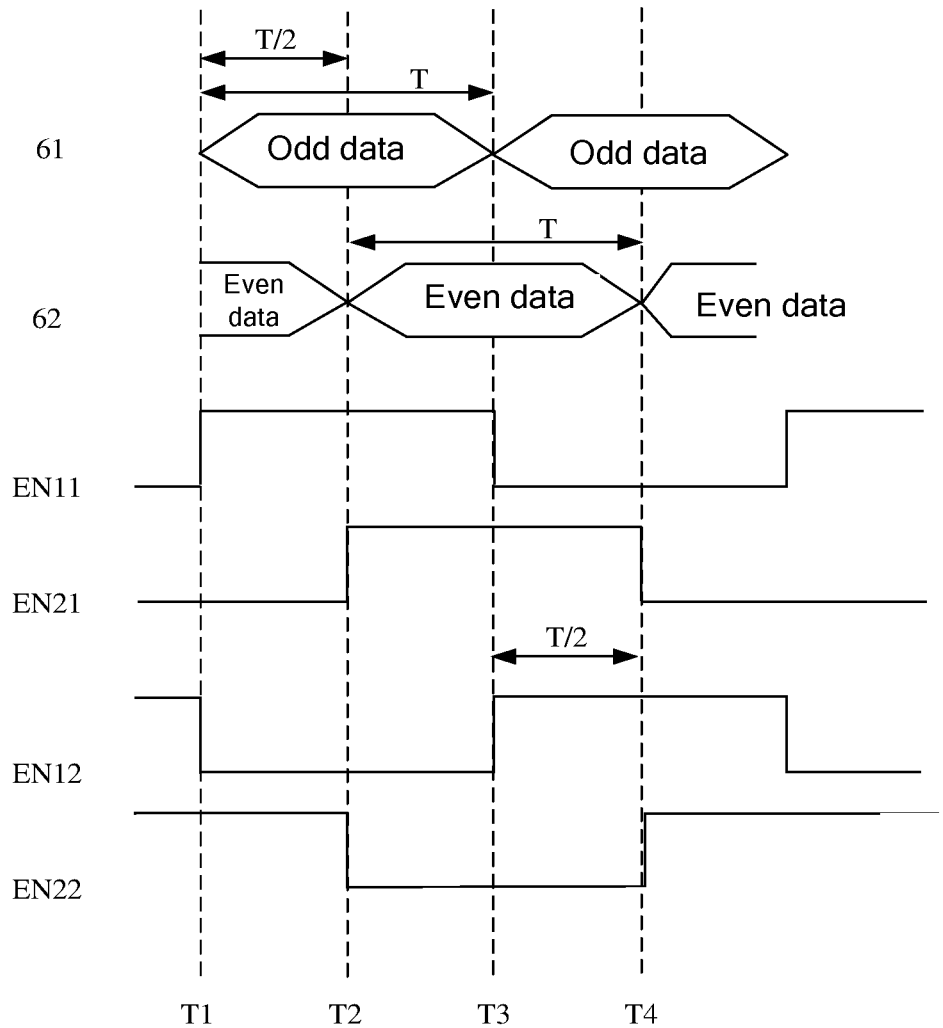
FIG. 7 is a diagram of signal timing corresponding to a setting mode of signal lines shown in FIG. 6.
FIG. 8 is a schematic diagram of a signal line driving method according to one embodiment of the present disclosure.

FIG. 7 is a diagram of signal timing corresponding to a setting mode of signal lines shown in FIG. 6.

Referring to FIG. 7, in one exemplary embodiment of the present disclosure, a transmission cycle of odd data and a transmission cycle of even data are both T, and a transmission interval between the odd data and the even data is T/2, that is, there is a phase difference of 180 degrees between the odd data and the even data.

At the first time T1, when the first enable signal EN11 corresponding to the odd data line 61 has a rising edge, the second enable signal EN12 corresponding to the odd data line 61 has a falling edge, the first driver 11 corresponding to the odd data line 61 changes to the drive state, the second driver 12 changes to the high-impedance state, and the signal on the odd data line 61 is controlled by the input signal of the first driver 11. At the third time T3, when the second enable signal EN12 corresponding to the odd data line 61 has a rising edge, the first enable signal EN11 corresponding to the odd data line 61 has a falling edge, the second driver 12 corresponding to the odd data line 61 changes to the drive state, the first driver 11 changes to the high-impedance state, and the signal on the odd data line 61 is controlled by the input signal of the second driver 12. At the second time T2, when the first enable signal EN21 corresponding to the even data line 62 has a rising edge, the second enable signal EN22 corresponding to the even data line 62 has a falling edge, the first driver 21 corresponding to the even data line 62 changes to the drive state, the second driver 22 changes to the high-impedance state, and the signal on the even data line 62 is controlled by the input signal of the first driver 21. At the fourth time T4, when the second enable signal EN22 corresponding to the even data line 62 has a rising edge, the first enable signal EN21 corresponding to the even data line 62 has a falling edge, the second driver 22 corresponding to the even data line 62 changes to the drive state, the first driver 21 changes to the high-impedance state, and the signal on the even data line 62 is controlled by the input signal of the second driver 22.

There is a phase difference of 180 degrees (T/2) between the first enable signal EN11 corresponding to the odd data line 61 and the first enable signal EN21 corresponding to the even data line 62, and there is a phase difference of 180 degrees (T/2) between the second enable signal EN12 corresponding to the odd data line 61 and the second enable signal EN22 corresponding to the even data line 62. At the same time, only one of the first enable signal EN11 and the second enable signal EN12 corresponding to the odd data line 61 is maintained at the high level, and only one of the first enable signal EN21 and the second enable signal EN22 corresponding to the even data line 62 is maintained at the high level.

By controlling both the odd data line 61 and the even data line 62 to be maintained in the drive state at any time, mutual influence between the odd data and the even data that are alternately transmitted can be avoided, and the data reliability is improved.

FIG. 8 is a schematic diagram of a signal line driving method according to one embodiment of the present disclosure.

The signal line driving method 800 can be applied to the signal line structure as shown in any embodiment above.

Referring to FIG. 8, the signal line driving method 800 may include: step S10, controlling a plurality of parallel signal lines to be maintained in a drive state at any time.

In one exemplary embodiment of the present disclosure, two ends of each of the signal lines are respectively provided with a first driver and a second driver. The controlling the parallel signal lines to be maintained in the drive state at any time includes: controlling, at the same time, only one of the first driver and the second driver of the same signal line to be maintained in the drive state.

In one exemplary embodiment of the present disclosure, the first driver or the second driver includes at least one gating inverter. The gating inverter is provided with an input terminal electrically connected to an input signal, an enable terminal connected to a first enable signal or a second enable signal, and an output terminal electrically connected to the signal line. The controlling, at the same time, only one of the first driver and the second driver of the same signal line to be maintained in the drive state includes: inputting the first enable signal at a first level into an enable terminal of the first driver so as to enable the first driver to be maintained in the drive state, and, at the same time, inputting the second enable signal at a second level into an enable terminal of the second driver so as to enable the second driver to be maintained in a high-impedance state; or inputting the first enable signal at the second level into the enable terminal of the first driver so as to enable the first driver to be maintained in the high-impedance state, and, at the same time, inputting the second enable signal at the first level into the enable terminal of the second driver so as to enable the second driver to be maintained in the drive state.

In one exemplary embodiment of the present disclosure, the first driver is provided with an input terminal for receiving a first input signal, an enable terminal connected to a first node, and an output terminal connected to the signal line. The second driver is provided with an input terminal for receiving a second input signal, an enable terminal connected to a second node, and an output terminal connected to the signal line. The first node is configured to receive a driver enable signal. The second node and the first node are connected through an odd number of inverters. The controlling, at the same time, only one of the first driver and the second driver to be maintained in the drive state includes: in response to a first input signal arrival message, setting the driver enable signal to be at a first level, such that the first driver is maintained in the drive state, and the second driver is maintained in a high-impedance state; and in response to a second input signal arrival message, setting the driver enable signal to be at a second level, such that the second driver is maintained in the drive state, and the first driver is maintained in the high-impedance state. In one exemplary embodiment of the present disclosure, the first level is a high level, and the second level is a low level.

In one exemplary embodiment of the present disclosure, two ends of each of the signal lines are respectively provided with a first driver and a second driver. The plurality of signal lines include odd data lines and even data lines. The controlling the parallel signal lines to be maintained in the drive state at any time includes: for a same odd data line, inputting a first enable signal at a first level into the first driver, and inputting a second enable signal at a second level into the second driver so as to enable the odd data line to be maintained in the drive state; or for the same odd data line, inputting the first enable signal at the second level into the first driver, and inputting the second enable signal at the first level into the second driver so as to enable the odd data line to be maintained in the drive state; and for a same even data line, inputting the first enable signal at the first level into the first driver, and inputting the second enable signal at the second level into the second driver so as to enable the even data line to be maintained in the drive state; or for the same even data line, inputting the first enable signal at the second level into the first driver, and inputting the second enable signal at the first level into the second driver so as to enable the even data line to be maintained in the drive state. The first enable signal corresponding to the odd data lines and the first enable signal corresponding to the even data lines have different phases, and the second enable signal corresponding to the odd data lines and the second enable signal corresponding to the even data lines have different phases.

The relevant principles of the signal line driving method 800 have been explained in the embodiments shown in FIG. 1 to FIG. 7. Details are not described herein again in the present disclosure.

Figure 9:
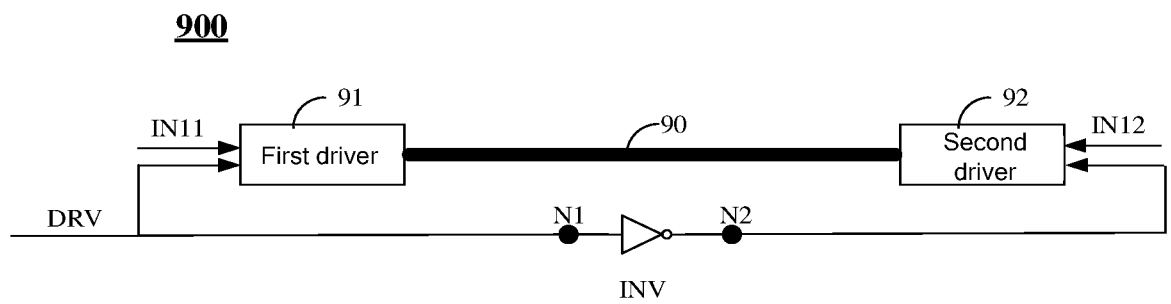
FIG. 9 is a schematic diagram of a signal line circuit according to one exemplary embodiment of the present disclosure.

FIG. 9 is a schematic diagram of a signal line circuit according to one exemplary embodiment of the present disclosure.

Referring to FIG. 9, the signal line circuit 900 includes:
a first driver 91 provided with an input terminal for receiving a first input signal IN11, an enable terminal connected to a first node N1, and an output terminal connected to a signal line 90;
a second driver 92 provided with an input terminal for receiving a second input signal IN12, an enable terminal connected to a second node N2, and an output terminal connected to the signal line 90; and
an inverter INV provided with an input terminal connected to the first node N1 and an output terminal connected to the second node N2, where the first node is configured to receive a driver enable signal DRV, and the driver enable signal DRV includes a first level configured to control the first driver 11 to be maintained in a drive state and the second driver 12 to be maintained in a high-impedance state, and a second level configured to control the second driver 12 to be maintained in the drive state and the first driver 11 to be maintained in the high-impedance state.

The signal line circuit 900 shown in FIG. 9 can ensure that the driver enable signal DRV can maintain, no matter in a high-level state or a low-level state, only one of the first driver 91 and the second driver 92 in the drive state. Therefore, it is not necessary to provide an isolation line and a state keeper for the signal line 90, and the signal line 90 can also be prevented from being influenced by level transition on a signal line parallel and adjacent to the signal line 90. Therefore, the signal line circuit 900 has a smaller wiring area.

It should be noted that although a number of modules or units of the device for execution are mentioned in the detailed description above, this division is not mandatory. In fact, according to the implementations of the present disclosure, the features and functions of two or more modules or units described above may be embodied in one module or unit. Correspondingly, the features and functions of a module or unit described above may be further divided into a plurality of modules or units to be embodied.

Those skilled in the art may easily figure out other implementations of the present disclosure after considering the specification and practicing the application disclosed herein. This application is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and concept of the present disclosure are specified by the appended claims.

INDUSTRIAL APPLICABILITY

According to embodiments of the present disclosure, by configuring the signal lines to be maintained in the drive state, when a plurality of signal lines are arranged in parallel, the crosstalk between the signal lines can be prevented from causing errors in transmitted data, and there is no need to provide an isolation wire and a state keeper, such that the layout area of the signal lines can be greatly saved.

The invention claimed is:

1. A signal line structure, comprising:
a plurality of parallel signal lines, wherein each of the signal lines is maintained in a drive state at any time; and,
wherein two ends of each of the signal lines are respectively connected to a first driver and a second driver, and at the same time, only one of the first driver and the second driver of the same signal line is maintained in a drive state; and,
the first driver is maintained in the drive state when a first enable signal is at a first level and maintained in a high-impedance state when the first enable signal is at a second level; and the second driver is maintained in the drive state when a second enable signal is at the first level and maintained in the high-impedance state when the second enable signal is at the second level; and,
the second enable signal is obtained by inverting the first enable signal through an inverter.

2. The signal line structure according to claim 1, wherein the first level is a high level, and the second level is a low level.

3. The signal line structure according to claim 1, wherein the first driver or the second driver comprises at least one gating inverter, and the gating inverter is provided with an input terminal electrically connected to an input signal, an enable terminal connected to the first enable signal or the second enable signal, and an output terminal electrically connected to the signal line.

4. The signal line structure according to claim 1, wherein the plurality of parallel signal lines comprise odd data lines and even data lines arranged in a staggered manner, the odd data lines are configured to transmit odd signals obtained according to sampling of odd clocks, the even data lines are configured to transmit even signals obtained according to sampling of even clocks, and there is a phase difference of 180 degrees between the odd clock and the even clock; and the first enable signal corresponding to the odd data lines and the first enable signal corresponding to the even data lines have different phases, and the second enable signal corresponding to the odd data lines and the second enable signal corresponding to the even data lines have different phases.

5. The signal line structure according to claim 4, wherein there is a phase difference of 180 degrees between the first enable signal corresponding to the odd data lines and the first enable signal corresponding to the even data lines, and there is a phase difference of 180 degrees between the second enable signal corresponding to the odd data lines and the second enable signal corresponding to the even data lines.

6. A signal line driving method, applied to the signal line structure according to claim 1, wherein the signal line driving method comprises:
controlling a plurality of parallel signal lines to be maintained in a drive state at any time; and,
wherein two ends of each of the signal lines are respectively provided with a first driver and a second driver; and controlling the parallel signal lines to be maintained in the drive state at any time comprises:
controlling, at the same time, only one of the first driver and the second driver of the same signal line to be maintained in a drive state; and,
the first driver or the second driver comprises at least one gating inverter, and the gating inverter is provided with an input terminal electrically connected to an input signal, an enable terminal connected to a first enable signal or a second enable signal, and an output terminal electrically connected to the signal line; and the controlling, at the same time, only one of the first driver and the second driver of the same signal line to be maintained in the drive state comprises:
inputting the first enable signal at a first level into an enable terminal of the first driver so as to enable the first driver to be maintained in the drive state, and, at the same time, inputting the second enable signal at a second level into an enable terminal of the second driver so as to enable the second driver to be maintained in a high-impedance state; or inputting the first enable signal at the second level into the enable terminal of the first driver so as to enable the first driver to be maintained in the high-impedance state, and, at the same time, inputting the second enable signal at the first level into the enable terminal of the second driver so as to enable the second driver to be maintained in the drive state.

7. The signal line driving method according to claim 6, wherein the first level is a high level, and the second level is a low level.

8. A signal line driving method, applied to the signal line structure according to claim 1, wherein the signal line driving method comprises:
controlling a plurality of parallel signal lines to be maintained in a drive state at any time; and,
wherein two ends of each of the signal lines are respectively provided with a first driver and a second driver; and controlling the parallel signal lines to be maintained in the drive state at any time comprises:
controlling, at the same time, only one of the first driver and the second driver of the same signal line to be maintained in a drive state; and,
the first driver is provided with an input terminal for receiving a first input signal, an enable terminal connected to a first node, and an output terminal connected to the signal line; the second driver is provided with an input terminal for receiving a second input signal, an enable terminal connected to a second node, and an output terminal connected to the signal line; the first node is configured to receive a driver enable signal; the second node and the first node are connected through an odd number of inverters; and controlling, at the same time, only one of the first driver and the second driver to be maintained in the drive state comprises:
in response to a first input signal arrival message, setting the driver enable signal to be at a first level, such that the first driver is maintained in the drive state, and the second driver is maintained in a high-impedance state; and
in response to a second input signal arrival message, setting the driver enable signal to be at a second level, such that the second driver is maintained in the drive state, and the first driver is maintained in the high-impedance state.

9. A signal line driving method, applied to the signal line structure according to claim 1, wherein the signal line driving method comprises:
controlling a plurality of parallel signal lines to be maintained in a drive state at any time; and,
wherein two ends of each of the signal lines are respectively provided with a first driver and a second driver; the plurality of signal lines comprise odd data lines and even data lines; controlling the parallel signal lines to be maintained in the drive state at any time comprises:
for a same odd data line, inputting a first enable signal at a first level into the first driver, and inputting a second enable signal at a second level into the second driver so as to enable the odd data line to be maintained in the drive state; or for the same odd data line, inputting the first enable signal at the second level into the first driver, and inputting the second enable signal at the first level into the second driver so as to enable the odd data line to be maintained in the drive state; and
for a same even data line, inputting the first enable signal at the first level into the first driver, and inputting the second enable signal at the second level into the second driver so as to enable the even data line to be maintained in the drive state; or for the same even data line, inputting the first enable signal at the second level into the first driver, and inputting the second enable signal at the first level into the second driver so as to enable the even data line to be maintained in the drive state, wherein
the first enable signal corresponding to the odd data lines and the first enable signal corresponding to the even data lines have different phases, and the second enable signal corresponding to the odd data lines and the second enable signal corresponding to the even data lines have different phases.

10. A signal line circuit, comprising:
a first driver, provided with an input terminal for receiving a first input signal, an enable terminal connected to a first node, and an output terminal connected to a signal line;
a second driver, provided with an input terminal for receiving a second input signal, an enable terminal connected to a second node, and an output terminal connected to the signal line; and
an inverter, provided with an input terminal connected to the first node and an output terminal connected to the second node, wherein the first node is configured to receive a driver enable signal, and the driver enable signal comprises a first level configured to control the first driver to be maintained in a drive state and the second driver to be maintained in a high-impedance state, and a second level configured to control the second driver to be maintained in the drive state and the first driver to be maintained in the high-impedance state.

* * * * *